(12) United States Patent
Amidi

(10) Patent No.: US 7,937,641 B2
(45) Date of Patent: May 3, 2011

(54) MEMORY MODULES WITH ERROR DETECTION AND CORRECTION

(75) Inventor: Mike H. Amidi, Lake Forest, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 1167 days.

(21) Appl. No.: 11/643,100

(22) Filed: Dec. 21, 2006

(65) Prior Publication Data

US 2008/0155378 A1 Jun. 26, 2008

(51) Int. Cl.
*H03M 13/00* (2006.01)
(52) U.S. Cl. .................... 714/758; 714/763; 714/798
(58) Field of Classification Search .............. 714/758, 714/710, 763, 718, 798, 800, 801; 711/137, 711/103
See application file for complete search history.

(56) References Cited

U.S. PATENT DOCUMENTS

| 3,878,333 | A | * | 4/1975 | Shimizu et al. | 178/23 A |
| 4,608,687 | A | * | 8/1986 | Dutton | 714/710 |
| 4,654,847 | A | * | 3/1987 | Dutton | 714/6 |
| 5,430,859 | A | * | 7/1995 | Norman et al. | 711/103 |
| 5,802,366 | A | * | 9/1998 | Row et al. | 709/250 |
| 7,161,857 | B2 | * | 1/2007 | Parekh | 365/200 |
| 7,636,813 | B2 | * | 12/2009 | Tremaine | 711/137 |

* cited by examiner

*Primary Examiner* — Fritz Alphonse

(57) ABSTRACT

A memory module having error detection and correction mechanisms. The memory module includes a plurality of memory devices arranged in an array and a buffer device connected to the memory devices. The buffer device includes a register module for synchronizing and buffering a plurality of input signals to the memory devices, an error detection module for detecting errors of the input signals, and a transmission memory for storing a copy of the input signals and transmitting the stored copy of the input signals as an output signal. A buffer device for a memory module. A method of operating a memory module. A memory including a plurality of registers arranged in a pipeline for storing a plurality of copies of the input signals and communicating the stored copies of the input signals as an output signal to an external device.

30 Claims, 6 Drawing Sheets

MEMORY MODULES WITH ERROR DETECTION AND CORRECTION

TECHNICAL FIELD

The present application relates to memory modules for computing devices. In particular, aspects of the present disclosure relate to registered or buffered memory modules with error detection and correction mechanisms.

BACKGROUND

Today's computing devices typically include a motherboard carrying a processor, multiple memory modules for supplying data to the processor, and a memory controller for controlling read/write operations between the processor and the memory modules. As the speed of the processor increases, the speed of read/write operations between the processor and the memory modules can create a bottleneck that makes it difficult to supply a sufficient amount of data to the processor for execution.

One solution is to increase the speed of read/write operations by, for example, raising the operating frequency of the memory modules. As the operating frequency increases, more read/write operations can be performed in a period of time, resulting in increased system speed. However, as the operating frequency increases, transmission errors can occur during read/write operations. For example, the processor can transmit an address to the memory modules to read data from a memory location corresponding to the transmitted address. Many conditions, such as power supply fluctuation, faulty bus connection, memory module failure, transmission crosstalk, etc., can corrupt the transmitted address to result in reading data from an incorrect memory location. Accordingly, there is a need for detecting and correcting transmission errors between the processor and the memory modules to achieve increased overall system performance.

DETAILED DESCRIPTION

A. Overview

The present disclosure describes devices, systems, and methods for memory error detection and correction in a computing device. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1-6.

B. Computing Device

Figure 1:
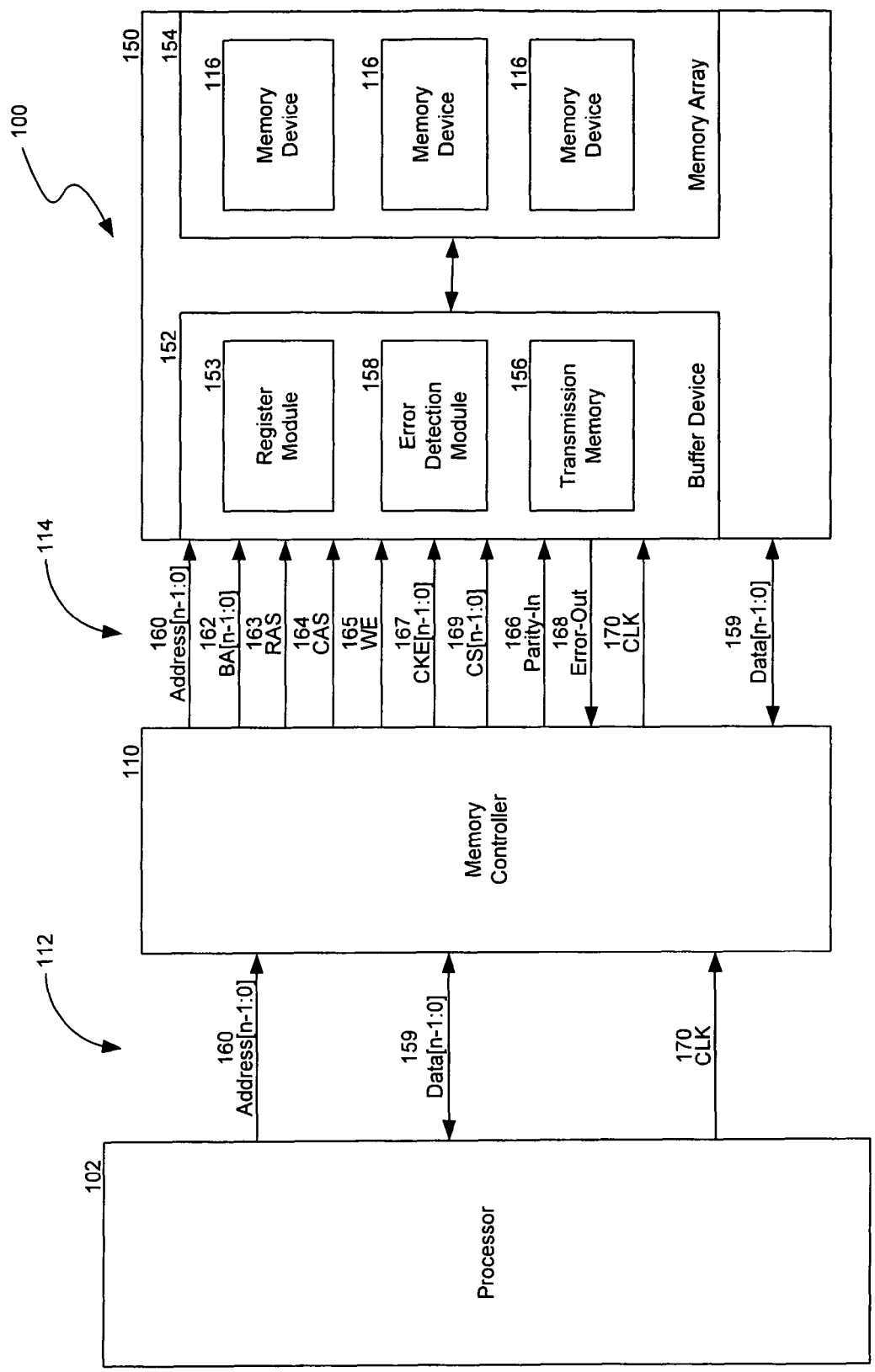
FIG. 1 is a block diagram showing a computing device configured in accordance with an embodiment of the invention.

FIG. 1 is a block diagram showing a computing device 100 having a registered and/or fully buffered memory module with error detection and correction mechanisms and configured in accordance with an embodiment of the invention. The computing device 100 includes a processor 102, a memory controller 110, and a memory module 150 connected in series. A first bus 112 connects the processor 102 to the memory controller 110, and a second bus 114 connects the memory controller 110 to the memory module 150.

In the illustrated embodiment, the first bus 112 can have channels including, for example, Address 160, data 159, and clock (CLK) 170, and the second bus 114 can have channels including, for example, Address 160, Bank (BA) 162, Row Address Strobe (RAS) 163, Column Address Strobe (CAS) 164, Write Enable (WE) 165, Clock Enable (CKE) 167, Chip Select (CS) 169, parity-in 166, error-out 168, CLK 170, and data 159. The processor 102, the memory controller 110, and the memory module 150 have corresponding terminals for each of these channels. In other embodiments, the first and second buses 112, 114 can have other channels (e.g., on-die-termination, ground, power supply, etc.) in addition to or in lieu of these described channels.

The processor 102 can include any single-core or dual-core processor with or without an onboard cache. For example, a suitable processor 102 can include an Intel® Core™ 2 Extreme processor manufactured by Intel Corp. of Santa Clara, Calif. The memory controller 110 can include any memory controller operable with the processor 102 to facilitate communication between the processor 102 and the memory module 150. One suitable memory controller 110 can include an Intel® 815EP memory controller device set or any other suitable devices.

The memory module 150 can include a buffer device 152 and a memory array 154 connected to the buffer device 152. The memory array 154 can include a plurality of memory devices 116 arranged into an array. Three memory devices 116 are shown in FIG. 1 for illustration purposes, but the memory module 150 can include any desired number of memory devices 116. The memory devices 116 can include stacked or singular DRAM, SDRAM, SRAM, DDR1, DDR2, DDR3, RLDRAM, FCRAM, Flash memory, Synchronous Flash memory, or other types of memory devices. The buffer device 152 can include a register module 153, an error detection module 158, and a transmission memory 156.

Figure 2:
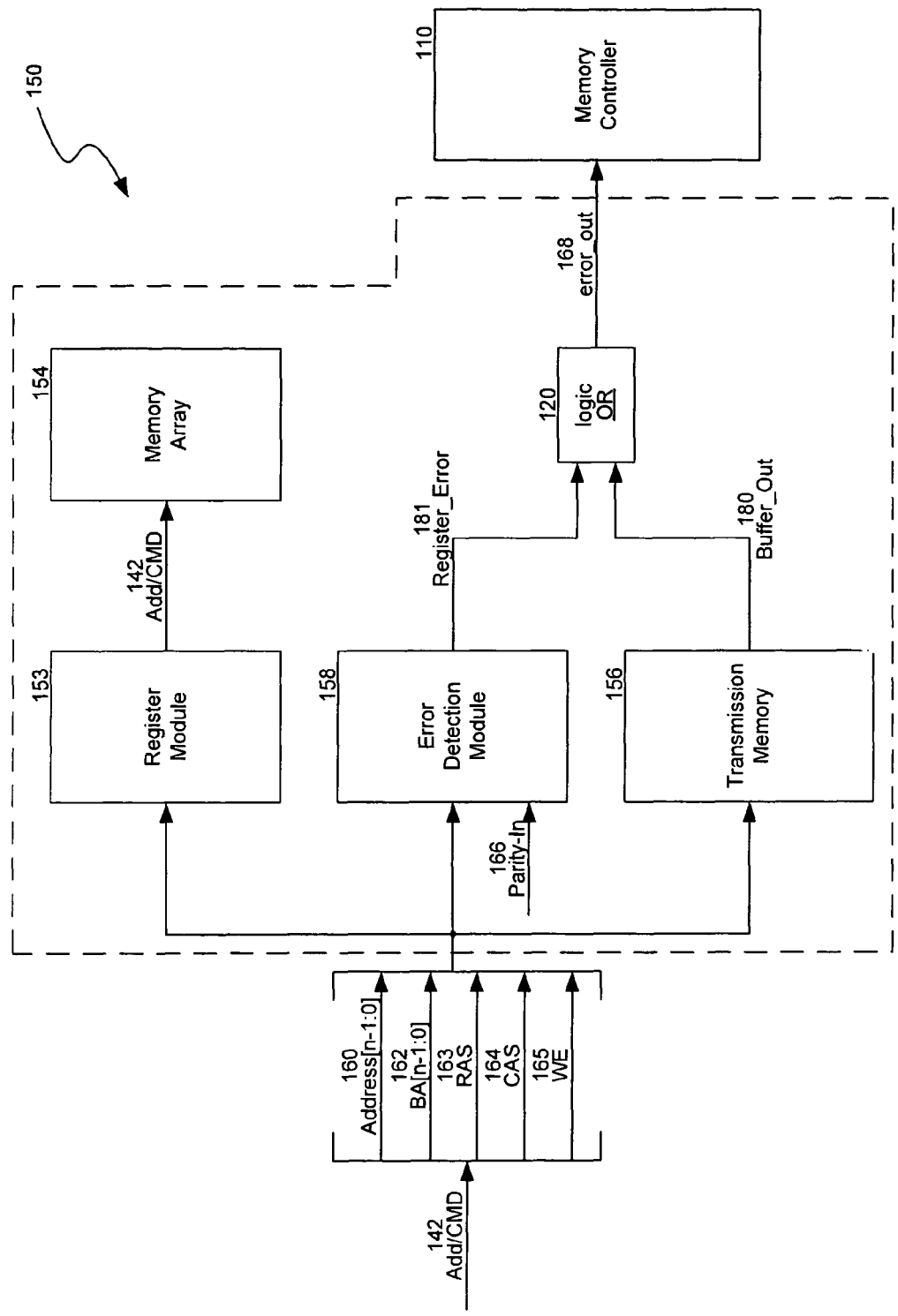
FIG. 2 is a routing diagram showing a memory module configured in accordance with an embodiment of the invention and suitable for use in the computing device of FIG. 1.

FIG. 2 is a routing diagram showing the various modules of the memory module 150 of FIG. 1 in more detail. In the illustrated embodiment of FIG. 2, a set of address/command (Add/CMD) signals 142, including Address 160, BA 162, RAS 163, CAS 164, and WE 165, is supplied to the register module 153, the error detection module 158, and the transmission memory 156 generally in parallel. The register module 153 receives and buffers the address/command signals 142 to the memory array 154, as described in more detail below with reference to FIG. 3. The error detection module 158 receives the address/command signals 142 and the parity-in 166 and outputs a register error 181 signal based on the received signals, as described in more detail below with reference to FIG. 4. The transmission memory 156 receives and stores the address/command signals 142 and can output the stored signals via a buffer-out 180 terminal when instructed to, as described in more detail below with reference to FIG. 5.

An output device 120 functioning as a logic OR ties the output ends of the error detection module 158 and the transmission memory 156 together such that the error detection module 158 and the transmission memory 156 share the output terminal error-out 168 to transmit signals to the memory controller 110. The output device 120 can be implemented as an OR gate, a wired-OR gate, an open collector, or other device functioning as a logic OR. One expected advantage of this arrangement is that the overall terminal layout of the buffer device 152 can remain unchanged. In other embodiments, the error detection module 158 and the transmission memory 156 can have separate output terminals (not shown) to the memory controller 110. For example, the signal register error 181 can be tied directly to the terminal error-out 168, and the signal buffer-out 180 can use an additional terminal (not shown) to communicate with the memory controller 110.

The operation of the computing device 100 is described below with reference to both FIG. 1 and FIG. 2. In operation, the processor 102 can direct the memory controller 110 to read/write data from the memory module 150. For example, the processor 102 can transmit instructions via the channels Address 160, CLK 170, and/or other channels to the memory controller 110 via the first bus 112 to read data from a specific location in the memory module 150. The memory controller 110 then processes the request from the processor 102 to derive instructions for the memory module 150. The derived instructions can include signals to be transmitted via the terminals including, for example, Address 160, BA 162, RAS 163, CAS 164, WE 165, CKE 167, CS 169, etc., to the memory module 150.

The memory controller 110 then transmits the derived instructions to the memory module 150 via the second bus 114. After receiving the transmitted instructions, the register module 153 of the buffer device 152 synchronizes and buffers the received address/command signals 142 to the memory array 154. In response, the memory array 154 returns the requested data from the specified location to the memory controller 110 via the terminal data 159, and the memory controller 110 in turn provides the retrieved data to the processor 102 via the first bus 112.

In one aspect of the illustrated embodiment, the computing device 100 is configured to detect and correct transmission errors of the address/command signals 142 using parity checking (either even or odd parity). As a first step, the memory controller 110 calculates a system parity bit of the address/command signals 142 to be sent to the memory module 150 according to a selected parity convention (e.g., even parity). For example, if the address/command signals 142 have a binary value of
  01011101
then the system parity bit would be 1 if even parity is used. If the address/command signals 142 have a binary value of
  01010101
then the system parity bit would be 0 if even parity is used. The memory controller 110 then stores a copy of the address/command signals 142 in its cache (not shown) and transmits the system parity bit via the terminal parity-in 166 and the address/command signals 142 via the terminals Address 160, BA 162, RAS 163, CAS 164, and WE 165 to the buffer device 152 of the memory module 150.

After receiving the address/command signals 142 and the system parity bit via the terminal parity-in 166, the buffer device 152 stores a copy of the address/command signals 142 in the transmission memory 156. The error detection module 158 calculates a register parity bit based on the received address/command signals 142 and compares the calculated register parity bit to the received system parity bit. If the register parity bit does not match the system parity bit, then the error detection module 158 declares an error, and the buffer device 152 transmits an error signal to the memory controller 110 via the terminal error-out 168. If the register parity bit matches the system parity bit, no error is declared.

If an error has been declared, the memory controller 110 can attempt to correct the error after receiving the error signal from the buffer device 152. After receiving the error signal, the memory controller 110 can halt operation of the memory module 150 and retrieve stored address/command signals 142 from the transmission memory 156. The memory controller 110 can then compare the retrieved address/command signals 142 to the copy stored in its cache to determine corrective actions. For example, the comparison can show that the transmitted address was changed from a first location to a second location in the memory module 150. The memory controller 110 can then initiate several corrective actions for the changed address signal.

In one embodiment, the memory controller 110 can retransmit the correct address to the memory module 150 via the second bus 114. After receiving the retransmitted address/command signals 142, the buffer device 152 can perform the error checking again as described above. If no error is found during retransmission, the memory controller 110 can conclude that the error was random and resume normal operation. If an error is again declared during retransmission, the memory controller 110 can, for example, mark the transmitted address location as a bad memory location, and reprocess the instructions from the processor 102 to derive and transmit a new set of address/command signals 142 corresponding to a different memory location to the memory module 150.

In another embodiment, the memory controller 110 can check to see whether the second location in the memory module 150 contains useful data before it is written to. For example, the memory controller 110 can retrieve stored address/command signals 142 stored in its cache and determine whether the second location was previously written to and with what data. If the second location had junk data, then the memory controller 110 can ignore the transmission error and resume normal operation. If the second location had useful data, then the memory controller 110 can restore the useful data in the second location and attempt to retransmit the previous address/command signals 142 stored in its cache to the memory module 150.

In yet another embodiment, after halting the memory operation, the memory controller 110 can record the comparison result, flag the processor 102 for the error, and wait for the processor 102 to issue further commands. In turn, the processor 102 can issue an alarm to an operator, display the recorded comparison results to the operator, and request input from the operator for further action. The operator can analyze the comparison result to determine whether the error is critical or non-critical and issue further instructions accordingly.

One expected advantage of the error detection and correction scheme is that the computing device 100 can have improved accuracy and operability for transmitting data between the processor 102 and the memory module 150. The computing device 100 not only can verify the integrity of transmitted signals but also can correct certain transmission errors. The error correction capability reduces the likelihood that the computer device 100 must be shut down when an error occurs, and thus improves the operability of the computing device 100.

Even though the computing device 100 is illustrated in FIG. 1 and FIG. 2 as using parity checking, in other embodiments, the computing device 100 can use other error detection and/or correction schemes. For example, the computing device 100 can also use cyclic redundancy check, polarity check, or other types of error checking schemes. Also, the error detection and correction scheme described above can be applied to other signals including, for example, CKE 167, CS 169, and CLK 170, transmitted between the memory controller 110 and the memory module 150, in addition to or in lieu of the address/command signals 142.

Also, even though the buffer device 152 is illustrated as integrated into the memory module 150 in FIG. 1, in other embodiments, the buffer device 152 can be a standalone device. For example, the buffer device 152 can be separately disposed onto a substrate (e.g., a printed circuit board, a semiconductor chip, etc.) from the memory array 154. In further embodiments, certain components can be omitted from the buffer device 152 and disposed independently or incorporated into the memory array 154. For example, the buffer device 152 can include only the transmission memory 156, and the register module 153 can be incorporated into the memory array 154, and the error detection module can be a standalone device.

C. Register Module

Figure 3:
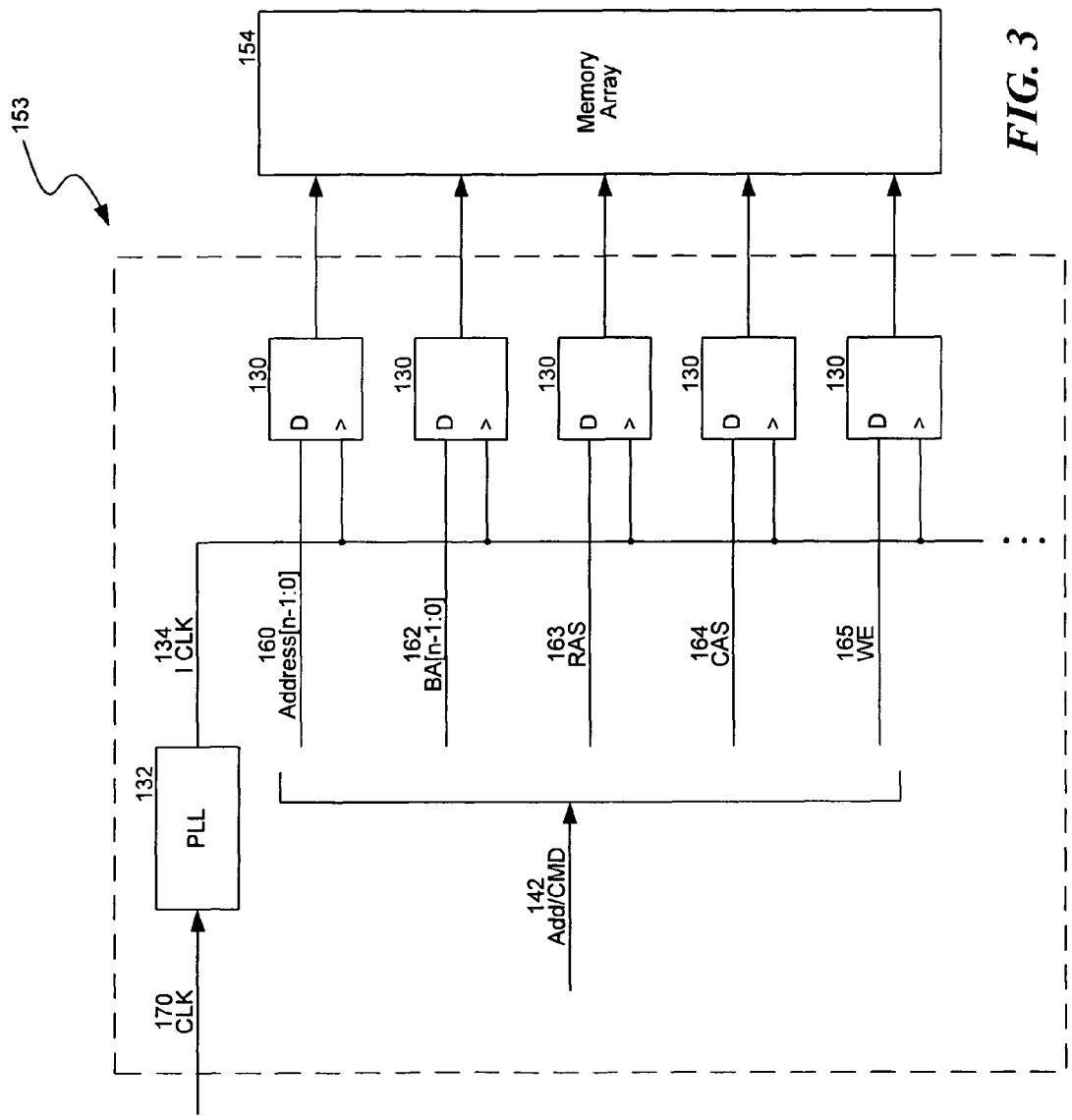
FIG. 3 is a block diagram showing a register module configured in accordance with an embodiment of the invention and suitable for use in the memory module of FIG. 2.

FIG. 3 is a block diagram showing a register module 153 configured in accordance with an embodiment of the invention and suitable for use in the memory module 150 of FIG. 2. The register module 153 includes a phase-locked loop (PLL) 132 connected to the terminal CLK 170 to receive a clock signal from the memory controller 110. Based on the received clock signal, the phase-locked loop 132 can generate an internal clock signal (ICLK) 134 synchronized with the received clock signal.

The register module 153 also includes a plurality of flip-flops 130 (shown as D-flip-flops, although other types can also be used). The data input of the individual flip-flops 130 is connected to one of the address/command signals 142, and the clock input of the individual flip-flops 130 is connected to the internal clock signal 134. The output of the plurality of flip-flops 130 is connected to the memory array 154. In operation, each of the address/command signals 142 is applied to the data input of a respective flip-flop 130. The internal clock signal 134 clocks the flip-flops 130 such that the address/command signals 142 are latched on during each transition of the internal clock signals 134.

Even though the register module 153 is illustrated as buffering the address/command signals 142, the register module 153 can also include additional flip-flops (not shown) to buffer additional signals onto the memory array 154. For example, the register module 153 can also buffer CKE, on-die-termination, or other signals transmitted to the memory module 150.

D. Error Detection Module

Figure 4:
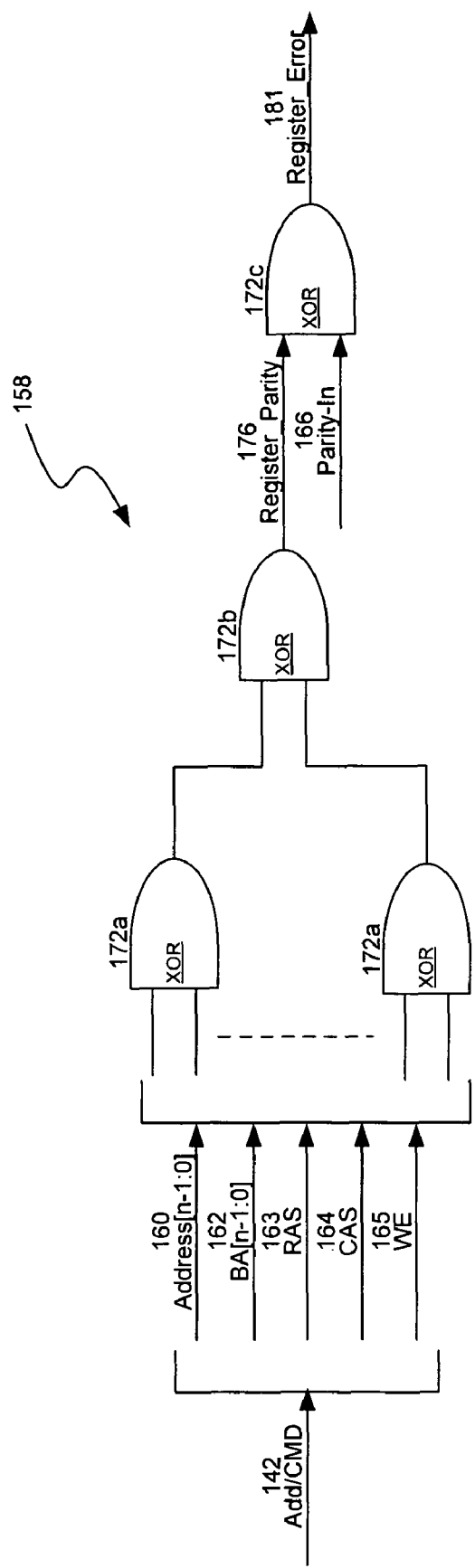
FIG. 4 is a block diagram showing an error detection module configured in accordance with an embodiment of the invention and suitable for use in the memory module of FIG. 2.

FIG. 4 is a block diagram showing an error detection module 158 configured in accordance with an embodiment of the invention and suitable for use in the memory module 150 of FIG. 2. The error detection module 158 includes a first set if XOR gates 172a arranged generally in parallel to each other for comparing each pair of the address/command signals 142. The output from the first set of XOR gates 172a is then applied to a second set of XOR gates 172b to generate a register parity bit 176. The error detection module 158 further includes a third XOR gate 172c that compares the register parity bit 176 to the system parity bit received via the terminal parity-in 166 to generate the register error 181. Even though the block diagram in FIG. 4 shows three levels, in certain embodiments, the number of levels can vary depending on the number of input signals and/or the implantation methodology.

E. Transmission Memory

Figure 5:
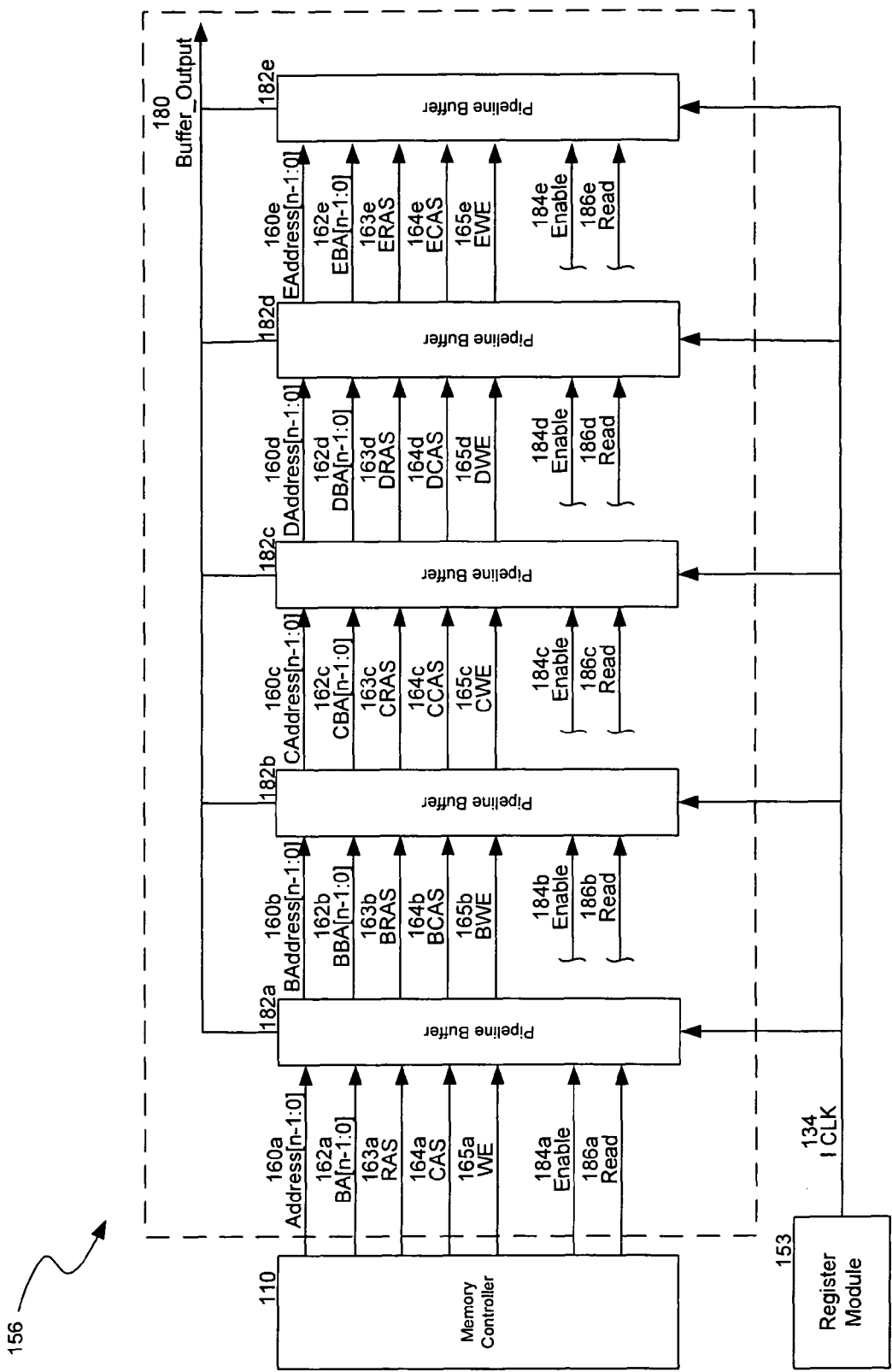
FIG. 5 is a block diagram showing a transmission memory configured in accordance with an embodiment of the invention and suitable for use in the memory module of FIG. 2.

FIG. 5 is a block diagram showing a transmission memory 156 configured in accordance with an embodiment of the invention and suitable for use in the memory module 150 of FIG. 2. The transmission memory 156 can include a plurality of pipeline buffers 182 (identified individually as 182a-e). The pipeline buffers 182 can include parallel-in/serial-out registers, shift registers, random access memory, and other first-in/first-out (FIFO) memory devices. The transmission memory 156 can have a capacity of N number of words each having M bytes (M and N are positive integers). M corresponds to the size of the input signals, and N corresponds to the number of copies to be stored in the transmission memory 156. Individual buffers 182a-e are connected to the internal clock signal 134 from the register module 153. Each buffer 182 also includes an output to the terminal buffer-out 180 and input terminals Enable 184 and Read 138 (identified individually as Enable 184a-e and Read 186a-e) for receiving instructions from the memory controller 110. In the illustrated embodiment, five copies can be stored in the five buffers 182a-e of the transmission memory 156. In other embodiments, any number of desired copies can be stored by selecting an appropriate number of buffers.

The buffers 182a-e are arranged back to back and configured to operate in a first-in-first-out fashion. For example, the first buffer 182a includes input terminals Address 160a, BA 162a, RAS 163a, CAS 164a, and WE 165a for receiving the address/command signals 142 from the memory controller 110 and output terminals connected to the input terminals BAddress 160b, BBA 162b, BRAS 163b, BCAS 164b, and BWE 165b of the second buffer 182b. The second buffer 182b includes output terminals connected to the input terminals CAddress 160c, CBA 162c, CRAS 163c, CCAS 164c, and CWE 165c of the third buffer 182c.

During a write operation, during each transition of each clock cycle of the internal clock signal 134, individual buffers 182a-e can transmit a stored set of the address/command signals 142 to the next buffer 182 (except the last register in the pipeline, i.e., the fifth buffer 182e) and receive and store a new set of the address/command signals 142. The new set of the address/command signals 142 overwrites the previous set. For example, the second buffer 182b can transmit its stored set of the address/command signals 142 to the third buffer 182c and receives a new set of signals from the first buffer 182a and overwrites the transmitted set. For the last buffer 182e in the pipeline, the stored address/command signals 142 are simply overwritten without transmitting to another register.

During a read operation, a particular buffer 182 can be enabled via the terminal Enable 184 and its content read out one bit at a time by applying a signal to the terminal Read 186. For example, if the second buffer 182b needs to be read out, then both Enable 184b and Read 186b are set high to select and read the second buffer 182b. During each transition of the clock cycle of the internal clock signal 134, the second buffer 182b supplies one bit of the stored address/command signals 142 to the terminal buffer-out 180 until all the stored data have been transmitted.

Figure 6:
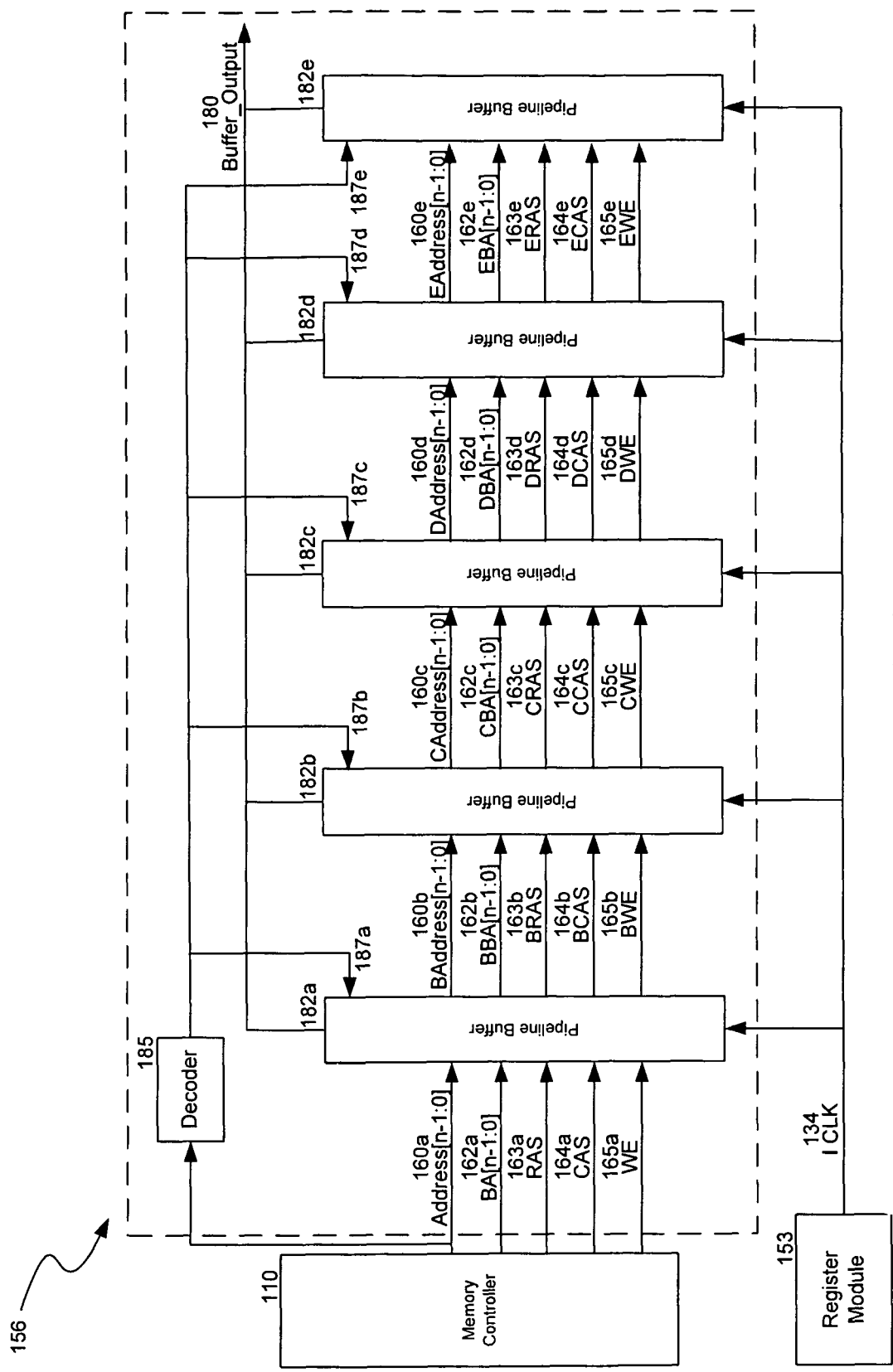
FIG. 6 is a block diagram showing a transmission memory configured in accordance with another embodiment of the invention and suitable for use in the memory module of FIG. 2.

Even though individual buffers 182 of the transmission memory 156 are illustrated in FIG. 5 as having dedicated Enable 184 and Read 186 terminals, the Enable 184 and Read 186 terminals can be omitted, as illustrated in FIG. 6. In the illustrated embodiment, the buffer device 156 can include a decoder 185 for addressing individual pipeline buffers 182.

The decoder 185 includes an input connected to the terminal Address 160a and output terminals 187 (identified individually as 187a-e) connected to each pipeline buffer 182a-e. The decoder 185 is configured to set a particular output terminal 187 high based on a received address from the terminal Address 160a. The decoder 185 can be implemented using NAND, AND, OR, NOR, or other logic circuits.

The individual buffers 182 can utilize other terminals of the memory module 150 during read operations without affecting data stored in the memory devices 116 (FIG. 1). For example, the memory module 150 can include double data rate (DDR), DDR2, or DDR3 memory devices. During a read operation from the pipeline buffers 182, the memory controller 110 can issue a DESELECT command to the memory module 150 by setting high the terminals CKE 167 and CS 169 (FIG. 1). As a result, the memory array 154 (FIG. 1) of the memory module 150 ignores any subsequent commands issued by the memory controller 110, and any data stored in the memory devices 116 are not affected.

The memory controller 110 can then utilize, for example, the terminal Address 160 to reference a particular buffer 182, the terminal RAS 163 to enable, and the terminal WE 165 to read from a particular pipeline buffer 182. In the illustrated embodiment, three address bits are required for the five buffers 182. In operation, the decoder 185 receives a pipeline buffer address (e.g., having a binary value of 001 corresponding to the second pipeline buffer 182b) via the terminal Address 160a and selects the second pipeline buffer 182b by, for example, setting high the output terminal 187b. Then, the RAS 163b and WE 165b can be set high to enable and read the second pipeline buffer 182b. During each transition of the clock cycle of the internal clock signal 134, the second buffer 182b supplies one bit of the stored address/command signals 142 to the terminal buffer-out 180 until all the stored data have been transmitted. One expected advantage of this embodiment is that the general input/output terminal layout of the memory module 150 can remain unchanged because some terminals can be used for accessing both the memory devices 116 and the pipeline buffers 182.

In other embodiments, the transmission memory 156 can be arranged to operate asynchronously from the internal clock signal 134. For example, the pipeline buffers 182 can be disconnected from the internal clock signal 134 and instead can be driven by a latch signal (not shown) from the memory controller 110. During operation, the buffers 182 are only written to when the latch signal is enabled instead of during each transition of the clock cycle of the internal clock signal 134. In further embodiments, certain terminals of the pipeline buffers 182 can be used to activate and deactivate the read operation by toggling a signal at certain terminals of the pipeline buffers 182 (e.g., WE 165).

In further embodiments, the memory module 150 can include at least one dedicated terminal and internal memory to receive instructions from the memory controller 110 for reading the transmission memory 156. For example, the memory module 150 can include a digital terminal and an internal bit (not shown) connected to the digital terminal. The memory controller 110 can then set or reset the internal bit to instruct the memory module 150 to halt normal operation and begin reading out the transmission memory 156.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I claim:

1. A memory module, comprising:
   a plurality of memory devices arranged in an array; and
   a buffer device connected to the memory devices, the buffer device including a register module for synchronizing and buffering a plurality of input signals to the memory devices, an error detection module for detecting errors of the input signals, and a transmission memory for storing a copy of at least a portion of the input signals and transmitting the stored copy as an output signal;
   the transmission memory including a plurality of parallel-in/serial-out registers arranged in a pipeline.

2. The memory module of claim 1 wherein the transmission memory further includes a decoder for addressing the plurality of parallel-in/serial-out registers.

3. The memory module of claim 1 wherein the pipeline is synchronized with a clock signal.

4. The memory module of claim 1 wherein the pipeline is asynchronous without a clock signal.

5. The memory module of claim 1 wherein the buffer device further includes an input terminal for receiving a system parity signal and an output terminal for sending an error signal.

6. The memory module of claim 5 wherein the output terminals from the error detection module and the transmission memory are tied using a device functional as a logic OR before being applied to the output terminal for sending the error signal.

7. The memory module of claim 1 wherein the memory devices are selected from a group consisting of DRAM, SDRAM, SRAM, DDR1, DDR2, DDR3, RLDRAM, FCRAM, Flash memory, and Synchronous Flash memory.

8. A computing device incorporating the memory module of claim 1 and further including a motherboard carrying a processor and a memory controller.

9. A memory module, comprising:
   a plurality of memory devices arranged in an array; and
   a buffer device connected to the memory devices,
   the buffer device including:
   a register module for synchronizing and buffering a plurality of input signals to the memory devices;

an error detection module for detecting errors of the input signals; and a transmission memory for storing a copy of at least a portion of the input signals and transmitting the stored copy as an output signal, wherein the transmission memory has a capacity of N number of words each having M bytes, wherein M corresponds at least in part to a size of the input signals and N corresponds to a number of copies of the input signals to be stored in the transmission memory.

10. A memory module, comprising:
a plurality of memory devices arranged in an array; and
a buffer device connected to the memory devices,
the buffer device including:
a register module for synchronizing and buffering a plurality of input signals to the memory devices;
an error detection module for detecting errors of the input signals; and
a transmission memory for storing a copy of at least a portion of the input signals and transmitting the stored copy as an output signal, wherein the error detection module calculates a register parity bit based on the input signals, compares the calculated register parity bit to a system parity bit, and declares an error if the register parity bit does not match the system parity bit.

11. A buffer device for a memory module having a plurality of memory devices, comprising:
a plurality of input terminals for receiving a plurality of input signals;
a register module for buffering the plurality of received input signals to the memory devices;
an error detection module for detecting errors of the input signals; and
a transmission memory for storing at least one copy of the input signals and transmitting the stored at least one copy of the input signals as an output signal to an external device;
the transmission memory includes a plurality of parallel-in/serial-out registers arranged in a pipeline.

12. The buffer device of claim 11 wherein the pipeline is synchronized with a clock signal.

13. The buffer device of claim 11 wherein the pipeline is asynchronous without a clock signal.

14. The buffer device of claim 11 wherein the buffer device further includes an input terminal for receiving a system parity signal and an output terminal for sending an error signal.

15. The buffer device of claim 14 wherein the output terminals from the error detection module and the transmission memory are tied using a device functional as a logic OR before being applied to the output terminal for sending the error signal.

16. The memory module of claim 11 wherein the memory devices are selected from a group consisting of DRAM, SDRAM, SRAM, DDR1, DDR2, DDR3, RLDRAM, FCRAM, Flash memory, and Synchronous Flash memory.

17. A computing device incorporating the buffer device of claim 11 and further including a motherboard carrying a processor and a memory controller.

18. A buffer device for a memory module having a plurality of memory devices, comprising:
a plurality of input terminals for receiving a plurality of input signals;
a register module for buffering the plurality of received input signals to the memory devices;
an error detection module for detecting errors of the input signals; and
a transmission memory for storing at least one copy of the input signals and transmitting the stored at least one copy of the input signals as an output signal to an external device; and the transmission memory has a capacity of N number of words each having M bytes, wherein M corresponds at least in part to a size of the input signals and N corresponds to a number of copies of the input signals to be stored in the transmission memory.

19. A buffer device for a memory module having a plurality of memory devices comprising:
a plurality of input terminals for receiving a plurality of input signals;
a register module for buffering the plurality of received input signals to the memory devices;
an error detection module for detecting errors of the input signals; and
a transmission memory for storing at least one copy of the input signals and transmitting the stored at least one copy of the input signals as an output signal to an external device; and
the error detection module calculates a register parity bit based on the input signals, compares the calculated register parity bit to a system parity bit, and declares an error if the register parity bit does not match the system parity bit.

20. A method of operating a memory module in a computing device, comprising:
calculating a system parity bit based on a set of input signals before sending the set of input signals from a memory controller to the memory module;
transmitting the set of input signals along with the calculated system parity bit to the memory module;
storing a copy of the input signals in a transmission memory and calculating a register parity bit based on the set of input signals received by the memory module;
comparing the register parity bit to the system parity bit; and
declaring an error if the register parity bit does not match the system parity bit; and
wherein the transmission memory includes a plurality of registers arranged in a pipeline, and wherein the method further includes storing additional copies of the input signals in a first-in/first-out fashion.

21. The method of claim 20 wherein the set of input signals includes at least one of an address signal and a command signal.

22. The method of claim 20, further comprising transmitting the stored copy of the input signal to the memory controller.

23. An apparatus for use with an external memory having at least one memory device, comprising:
a plurality of input terminals for receiving a plurality of input signals;
a register module buffering the plurality of received input signals to the at least one memory device;
an error detection module for detecting errors of the input signals; and
a second memory including a plurality of registers arranged in a pipeline for storing a plurality of copies of the input signals and communicating the stored copies of the input signals as an output signal to an external device.

24. The apparatus of claim 23, wherein the plurality of registers are configured for storing the plurality of copies of the input signals in a first-in/first-out fashion.

25. The apparatus of claim 23, wherein the second memory has a capacity of N number of words each having M bytes, wherein M corresponds at least in part to a size of the input signals and N corresponds to a number of copies of the input signals to be stored in the transmission memory.

26. The apparatus of claim 23, wherein the second memory includes a plurality of parallel-in/serial-out registers arranged in a pipeline.

27. The apparatus of claim 23, wherein the error detection module calculates a register parity bit based on the input signals, compares the calculated register parity bit to a system parity bit, and declares an error if the register parity bit does not match the system parity bit.

28. A method of operating a memory, comprising:
   calculating a system parity information based on a set of input signals before sending the set of input signals from a memory controller to the memory;
   communicating the set of input signals with the calculated system parity to the memory;
   storing copies of the input signals in a second memory having a plurality of storage elements arranged in a pipeline in a first-in first-out manner, and calculating register parity information based on the set of input signals received by the memory;
   comparing the register parity information to the system parity information; and
   declaring an error if the register parity information does not match the system parity information.

29. The method in claim 28, wherein the plurality of copies of the input signals are sequential versions of the input signals received at different sequential times.

30. The method in claim 28, wherein the storage elements comprise storage registers, the register parity information comprises a register parity bit, and the system parity information comprises a system parity bit.

* * * * *